United States Patent [19]

Nair

[11] Patent Number: 4,948,759
[45] Date of Patent: Aug. 14, 1990

[54] GLASS CERAMIC DIELECTRIC COMPOSITIONS

[75] Inventor: Kumaran M. Nair, East Amherst, N.Y.

[73] Assignee: E. I. Du Pont de Nemours and Company, Wilmington, Del.

[21] Appl. No.: 423,649

[22] Filed: Oct. 19, 1989

Related U.S. Application Data

[63] Continuation of Ser. No. 885,829, Jul. 15, 1986, abandoned.

[51] Int. Cl.$^5$ .......................... C03C 8/14; C03C 8/16; C03C 8/02; C03C 3/066
[52] U.S. Cl. ....................................... 501/17; 501/20; 501/21; 501/37; 501/79; 501/8
[58] Field of Search .................. 501/8, 15, 17, 20, 79, 501/66, 136, 137, 21, 37

[56] References Cited

U.S. PATENT DOCUMENTS

| | | | |
|---|---|---|---|
| 3,649,353 | 3/1972 | Ulrich | 117/212 |
| 3,787,219 | 1/1974 | Amin | 106/73.3 |
| 3,816,172 | 6/1974 | Hoffman | 117/212 |
| 3,848,079 | 11/1974 | Amin | 174/68.5 |
| 4,358,541 | 11/1982 | Andrus et al. | 501/8 |
| 4,392,180 | 7/1983 | Nair | 361/321 |
| 4,613,560 | 9/1986 | Dueber et al. | 430/286 |

FOREIGN PATENT DOCUMENTS 225126 7/1985 German Democratic Rep. .
233995 3/1986 German Democratic Rep. .

Primary Examiner—Ferris H. Lander

[57] ABSTRACT

The invention is directed to thick film glass ceramic dielectric compositions in which the dielectric is a mixture of amorphous aluminoborosilicate glass, which upon firing forms a single phase of ceramic crystals in a matrix of amorphous remainder glass, and a ceramic additive to minimize substrate bowing.

5 Claims, No Drawings

GLASS CERAMIC DIELECTRIC COMPOSITIONS

This application is a continuation of application Ser. No. 885,829 filed July 15, 1986 and now abandoned.

FIELD OF INVENTION

The invention relates to glass ceramic dielectric composite compositions and particularly to such compositions for use in multilayer dielectrics.

BACKGROUND OF THE INVENTION

Dielectric materials for use in multilayer dielectric systems are subject to severe thermal stresses because of the multiplicity of firing and coating cycles which they undergo during the building up of multilayer structures. In particular they must have good electrical properties such as low sheet capacitance (K<10), high insulation resistance (>1×10$^{12}$ VDC) and high breakdown voltage (>500 V/mil). Simultaneously, they must throughout the many processing cycles remain thermally conductive, be compatible with the conductor materials used therewith and, most importantly, the adherent layers of substrate and dielectric materials must remain flat upon completion of the firing cycles.

Warpage of ceramic substrates having adherent layers of dielectrics is commonly known as "bowing". One cause of bowing is mismatching of the thermal coefficients of expansion (TCE) of the adherent layers and the substrate. When the TCE of the substrate is substantially less than that of the dielectric layer, bowing in the direction of the dielectric layer away from the substrate takes place. When this occurs, the dielectric layer undergoes severe compressive stresses. On the other hand, when the TCE of the dielectric is substantially less than that of the substrate layer, bowing in the direction of the substrate away from the dielectric layer takes place. When this occurs the dielectric layer undergoes severe tensile stresses.

Though TCE mismatch can be a frequent cause of substrate bowing, the phenomenon is also facilitated by the number and thickness of the dielectric layers and is a function too of the thickness of the substrate.

To the extent substrate bowing is caused mainly by TCE mismatch the problem can often be overcome by the addition to the dielectric of materials the TCE of which more closely match that of the substrate. Such additions must, however, be minimized in order to avoid detrimental effects on the electrical properties of the dielectric material. Commercially available dielectric materials contain as much as 50% wt. of added ceramic oxides such as $Al_2O_3$ and $SiO_2$. But such high concentrations of ceramic oxides reduce the ability of the compositions to sinter and to form a nonporous film when they are fired under Thick Film Processing Conditions and thus tend to degrade the reliability of the dielectric composite materials. In particular leakage current tends to be raised and breakdown voltage tends to be lowered by such additions. Moreover not all bowing problems are due to TCE mismatch in which case the addition of TCE mismatch materials may be of little value. Thus dielectric layers have TCE values which closely match those of the substrate can still incur substrate bowing.

In copending U.S. application Ser. Nos. 885,827 and 885,828 filed concurrently herewith, applicant has proposed the use as dielectric materials of certain amorphous crystallizing glasses which upon firing form a single ceramic crystalline phase. Because of the excellent reliability of these glass ceramic dielectrics it is highly desirable to be able to formulate them so that substrate bowing can be substantially reduced without significantly degrading their excellent electrical properties. More particularly it is essential that the electrical reliability of multilayer system using these unique materials be maintained while at the same time substrate bowing is minimized.

SUMMARY OF THE INVENTION

The invention is, therefore, directed to a printable thick film dielectric composition consisting essentially of (a) finely divided particles of an amorphous aluminoborosilicate glass which is crystallizable at thick film processing conditions to form a single phase of ceramic crystals in a matrix of amorphous remainder glass, (b) 1–15% wt., basis total solids, of a ceramic material selected from $Al_2O_3$, $SiO_2$, complex oxides of $Al_2O_3$ and $SiO_2$, $Si_3N_4$, AlN, complex nitrides $Si_3N_4$ and AlN and mixtures thereof, the admixture being dispersed in (c) organic medium.

DEFINITIONS

Thick Film Processing Conditions

As used herein, the captioned term refers to a firing cycle of approximately 60 min., of which 10 min. is at a peak temperature of 800°–950° C.

Remainder Glass

When the glasses of the invention are heated under thick film process conditions, a single crystal phase is formed out of the parent glass. The thusly formed crystals are dispersed in a matrix of the parent glass which has been changed in composition by the formation of the crystals therefrom. This glass, which remains after crystal formation and which serves as a matrix for the formed ceramic crystals, is referred to herein as "remainder glass".

PRIOR ART

U.S. Pat. No. 3,787,219 Amin

The reference is directed to a printable dielectric composition consisting of 1–40% wt. $CaTiO_3$ and 99–60% wt. of a lead-free crystallizable glass frit. Upon firing, one major crystalline phase is formed from the glass - celsian ($BaAl_2Si_2O_8$) -and two minor phases are formed - sphene ($CaTiSiO_5$) and zinc orthosilicate [$(ZnO)_2SiO_2$].

U.S. Pat. No. 3,649,353 Ulrich

The reference is directed to a dielectric thick film composition consisting of 10–90% wt. $BaTiO_3$ and a crystallizable lead-free $BaTiO_3$ glass frit. Upon firing at 700°–1300° C., two crystalline phases are formed. The frit composition by weight is 54.7% BaO, 24.0% $TiO_2$, 3.2% $BaF_2$, 7.9% $Al_2O_3$, 2.0% $GeO_2$ and 8.2% $SiO_2$.

U.S. Pat. No. 4,392,180 Nair

The Nair patent is directed to thick film dielectric compositions comprising substituted perovskite inorganic dopant and a low temperature-devitrifiable frit. The frit is disclosed generally to include glasses which yield a single crystalline phase having the same composition as the present glass or which yield multiple crystalline phases having different compositions than the parent glass.

DETAILED DESCRIPTION OF THE INVENTION

A. Glass Frit

The glass frits suitable for the invention are amorphous aluminum borosilicates of two types both of which when subjected to thick film processing conditions form a single ceramic crystalline phase. By X-ray diffraction studies, it has been determined that the first glass type forms a crystalline phase of celsian ($BaAl_2Si_2O_8$) and no other detectable phase while the second glass type forms a crystalline phase of an aluminate of Ba, Ca, Mg or Zn and no other detectable phase. In each case, the single crystalline phase is dispersed through a matrix of amorphous remainder glass. In the case of both glass types, only a single crystal phase is produced when the glass is fired at 800°-950° C.

Preferred compositions of the two types of glasses are given in Table 1 below.

TABLE 1

| Preferred Amorphous Glass Frit Compositions | | | |
|---|---|---|---|
| Glass Designation | A | B | C |
| Glass Type | I | I | II |
| Composition | | % wt. | |
| $SiO_2$ | 30 | 30 | 30 |
| $TiO_2$ | 8 | 8 | 8 |
| $Al_2O_3$ | 10 | 10 | 12 |
| BaO | 26 | 10 | 12 |
| ZnO | 10 | 10 | 24 |
| CaO | 6 | 24 | 6 |
| $B_2O_3$ | 8 | 8 | 8 |
| MgO | 2 | — | — |

It is essential that the amorphous glass frit contain either $TiO_2$ or $ZrO_2$, either or both of which serve as a nucleating agent for the formation of the celsian or aluminate crystals during the thick film firing process.

Though mixtures of the nucleating agents can be used, the total amount must be at least 8% weight in order to control the crystallization which takes place during standard thick film firing conditions. Higher concentrations of nucleating agents, though unnecessary, are not usually detrimental depending on the paste processing conditions.

The glasses are prepared by conventional glass-making techniques, i.e., by mixing the desired components in the desired proportions and heating the mixture to form a melt. As is well known in the art, heating is conducted to a peak temperature and for a time such that the melt becomes entirely liquid and homogeneous. In preparing the compositions of the invention, the components are premixed by shaking in a polyethylene jar with plastic balls and then melted in a platinum or ceramic container at about 1500° C. The melt is heated at the peak temperature for a period of at least one hour. Heating for less than one hour would result in inhomogeniety in the glass. A heating time of 1.5-2 hours is preferred. The melt is then poured into cold water. The maximum temperature of the water during quenching is kept below 120° F. by increasing the volumetric ratio of water to melt. The crude frit after separation from water is freed of residual water by drying in air of by displacing the water with methanol. The crude frit in slurry form is then ball-milled for 20-24 hrs. in alumina containers using alumina balls. Alumina picked up by the materials, if any, is not within observable limits as measured by X-ray diffractional analysis.

After discharging the milled frit slurry from the mill, excess solvent is removed by decantation and the frit powder is air dried at room temperature. The dried powder is then screened through a 325 standard mesh screen to remove any large particles.

When the glasses of the invention are heated under thick film process conditions, a single phase of ceramic crystals is formed out of the parent glass, crystals of which are dispersed in a matrix of the remainder glass, i.e. the glass which remains after crystallization. The remainder glass is always of different composition than the crystallized phase but may or may not have the same softening point.

B. Added Ceramic Component

The added ceramic component of the invention is a refractory compound selected from $Al_2O_3$, $SiO_2$, complex oxides of $Al_2O_3$ and $SiO_2$, $Si_3N_4$, AlN, complex nitrides of $Si_3N_4$ and AlN and mixtures thereof be used as well. At least 1% wt. basis total solids is needed to get a significant effect however the maximum advantageous concentration of added ceramic material is quite variable. For example is type I glasses leakage current becomes excessive if about 15% wt. $Al_2O_3$ is used. However in type II glasses undeterminably higher amounts of $Al_2O_3$ can be used without any adverse affect on electrical properties. On the other hand, when $SiO_2$ is used in glass A (A type I glass) higher amounts of $SiO_2$ can be used without any adverse affect on electrical properties. Yet when $SiO_2$ is added to glasses B or C leakage current becomes excessive if about 15% wt. $SiO_2$ is used. More interesting still is the phenomenon that when mixtures of both $Al_2O_3$ and $SiO_2$ are used glass A as much as 20% of a 3 to 1 mixture of $Al_2O_3$ and $SiO_2$ yield a dielectric layers having quite good properties. Thus the maximum tolerable amount of added ceramic material from the standpoint of electrical reliability is subjective to the type of glass and its wetting characteristics as well as the particular ceramic material used.

The added ceramic material should be course be of particle size appropriate to the method of printing the composition for most printing applications it is preferred that the added ceramic materials be within the range of 1 to 50 microns.

Organic Medium

The dielectric compositions described above will ordinarily be formed into paste which is capable of being printed in any desired circuit pattern. In its simplest aspects, such pastes are made merely by dispersing the dielectric powder mixture into an appropriate organic medium (vehicle).

Any inert liquid can be used as the vehicle. Water or any one of various organic liquids, with or without thickening agents, stabilizing agents and/or other common additives, can be used as the vehicle. Exemplary of the organic liquids which can be used are aliphatic alcohols, esters of such alcohols such as the acetates and propionates, terpenes such as pine oil, terpineol and the like, solutions of resins such as the polymethacrylates of lower alcohols, or solutions of ethyl cellulose in solvents such as pine oil and monobutyl ether of ethylene glycol monoacetate. The vehicle can also contain volatile liquids to promote fast setting after printing to the substrate.

A preferred vehicle is based on ethyl cellulose and β-terpineol in a weight ratio of about 1:8. The pastes are conveniently prepared on a three-roll mill. A preferred viscosity for these compositions is approximately 100–200 Pa.s, measured on a Brookfield HBT viscometer using a #5 spindle at 10 rpm. The amount of vehicle utilized is determined by the final desired formulation viscosity.

Test Procedures

Capacitance

Capacitance is a measure of the capability of a material to store an electric charge. Expressed mathematically, C=KA divided by t, where A equals area overlap of the conductors, t is thickness of the dielectric layer and K is dielectric constant.

The units of capacitance are farads or fractions thereof such as microfarads, $10^{-9}$ farad, or picofarads $10^{-12}$ farad.

Dissipation Factor

Dissipation Factor (DF) is a measure of the phase difference between voltage and current. In a perfect capacitor, the phase difference would be 90°. However, in practical dielectric systems, DF is less than 90° because of leakage and relaxation losses. In particular, DF is the tangent of the angle by which the current lags the 90° vector.

Insulation Resistance

Insulation resistance (IR) is a measure of the ability of a charge capacitor to withstand leakage in DC current. Insulation resistance is a constant for any given dielectric regardless of capacitance.

To perform the IR test under hot conditions, which is a measure of reliability, the test voltage was increased to 200 v, the test capacitor was heated to 125° C. and the time of testing was extended to 64 hrs. The test itself measures "RC Product", which is the product of IR times Capacitance. The IR is then calculated from the RC product by dividing into it the previously measured value of Capacitance. Under these conditions, the IR is determined periodically during the aging process. An IR value of $1 \times 10^9$ ohms is considered to be satisfactory and IR values less than $1 \times 10^9$ ohms are considered to be failures.

Breakdown Voltage

The Breakdown Voltage test (also called the dielectric-strength test) consists of the application of a voltage higher than rated voltage for a specific time between mutually insulated portions of a component part or between insulated portions and ground. The voltage is raised until the system fails which is indicated by short circuiting. This is used to observe whether the component part can operate safely at its rated voltage and withstand momentary overpotentials due to switching, surges, and other similar phenomena. Although this test is often called a voltage breakdown or dielectric-strength test, it is not intended that this test cause insulation breakdown or that it be used for detecting corona. Rather it serves to determine whether insulating materials and spacings in the component part are adequate. When a component part is faulty in these respects, application of the test voltage will result in either disruptive discharge or deterioration. Disruptive discharge is evidenced by flashover (surface discharge), sparkover (air discharge), or breakdown (puncture discharge). Deterioration due to excessive leakage currents may change electrical parameters or physical characteristics. Dielectric breakdown is reported in volts/mil or volts/cm of dielectric thickness. Dielectric layers are designed to have sufficient thickness to provide a margin of safety well below the breakdown of the electric. The test is conducted in accordance with MIL-STD-202E, Apr. 16, 1973.

Leakage Current

The Leakage Current test is a measure of the level of hermeticity of a fired dielectric film as measured by a D.C. voltage-driven electrolytic current when the dielectric is immersed in a saline solution.

Test specimens are prepared by printing a thick film conducting pattern on twelve $2'' \times 2''$ $Al_2O_3$ substrates. The conductor patterns are oven dried at 110°–120° C. and then fired at 850° C. Two layers of patterned dielectric materials are then applied sequentially on top of the fired conductor. Each of the layers is oven-dried at 150° C. and fired at 850° C. Thickness of the combined dielectric layers is 30–50 $\mu$m.

These test prints are placed in a prewired connector and positioned in a 1.0N NaCl solution so that the test print is completely immersed. Using a platinum anode, 10 volts are applied between the conductor assembly and anode and the current for each of 10 test samples is measured after 5 mins. under voltage. A leakage current of 50 $\mu A/cm^2$ or less is considered satisfactory.

High Humidity Bias Time Test (HHBT)

In this test, the percentage of part failures due to insufficient IR is measured after the part has been subjected to an environment of 85% relative humidity, 85° C. and a stress of 5 VDC for 1,000 hrs. After 1,000 hrs. of these conditions, 100 VDC is applied across the terminal and the IR of the part is measured periodically as described above. Insulation resistance of $1 \times 10^9$ ohms/100 VDC is considered satisfactory. Below $1 \times 10^9$ ohms/100 VDC is considered a failure.

High Bias Time Test (HBT)

In this test, the percentage of part failures due to insufficient IR is measured periodically after the part has been subjected to an environment of 150° C. and 200 VDC for a period of at least 1,000 hrs. After 1,000 hrs. at these conditions, 100 VDC is applied across the terminal and the IR of the part is measured as described above. Pass/fail criteria are the same as for the HHBT test described above.

Substrate Bowing

The purpose of the test is to measure the amount of substrate bowing which is caused by differences in the temperature coefficient of expansion (TCE) of the substrate and of the dielectric when the dielectric is printed over a large area. When the TCE of the dielectric is greater than the TCE of the substrate, the dielectric layer is in tension and undergoes bowing toward the center of the dielectric layer. (Positive bowing.) When the TCE of the dielectric is less than the TCE of the substrate, the dielectric layer is in compression and undergoes bowing away from the center of the dielectric layer. (Negative bowing.)

Test samples are prepared by printing nine layers of a dielectric pattern through a 325 mesh printing screen onto six $2'' \times 2''$ $Al_2O_3$ substrates. Each of the substrates has been preselected to show a flatness within 0.5 mils as measured by a dial comparator which has been modified to support the substrates by the edges only. The dielectric layers are applied in sets of three, each layer of which is oven dried at 110°–120° C. and cofired at 850° C. The process is then repeated for the second and third set of dielectric layers. When all three sets of three dielectric layers have been dried and fired, the bowing of the substrate is measured by means of the above referred dial comparator. The process is repeated for as many as 20 firing cycles.

FORMULATION

The glass-ceramic compositions of the invention will ordinarily be formulated into a paste which is capable of being printed in any desired circuit pattern. Such pastes are made by dispersing the anhydrous glass frit into an appropriate organic medium as described herein above.

EXAMPLES

Two series of thick film pastes comprising 72.5% wt. solids and 27.5% wt. organic medium were prepared from glasses A, B and C. In one series (Examples 2-4), 5-15% wt. of $Al_2O_3$ and in the second series (Examples 5-7) 5-15%. wt. $SiO_2$ was added. Dielectric layers were applied to an alumina substrate, fired and tested in the above described manner. Each of these parts was tested with respect to leakage current and breakdown voltage. These data are given in Table 2 below.

EXAMPLES 22-27

A further series of thick film pastes was prepared and applied to alumina substrates in the same manner as Examples 1-21 in which $Al_2O_3$ and mixtures of $Al_2O_3$ and $SiO_2$ were added to a different lot of Glass A. The data from these tests are shown in Table 3 below:

TABLE 3

Effect of Substrate Additive Mixtures On Dielectric Properties

| Example No. | $Al_2O_3/SiO_2$ % wt. | Leakage Current $\mu A/cm^2$ | Breakdown Voltage V/mil |
|---|---|---|---|
| 22 | 0/0 | 1.2 | 1000 |
| 23 | 5/0 | 21.4 | 700 |
| 24 | 15/0 | 23.5 | 1090 |
| 25 | 0/5 | 7.4 | 740 |
| 26 | 10/5 | 9.4 | 1170 |
| 27 | 15/5 | 14.3 | 1030 |

TABLE 2

Electrical Properties of Thick Film Glass-Ceramic Layers Containing Added Ceramic Materials - Effect of Concentration

| Example No. | 1 | 2 | 3 | 4 | 5 | 6 | 7 | 8 | 9 | 10 | 11 | 12 |
|---|---|---|---|---|---|---|---|---|---|---|---|---|
| Ceramic Addition | | | | | | | | | | | | |
| Composition | Control | $Al_2O_3$ | $Al_2O_3$ | $Al_2O_3$ | $SiO_2$ | $SiO_2$ | $SiO_2$ | Control | $Al_2O_3$ | $Al_2O_3$ | $SiO_2$ | $SiO_2$ |
| Amount, % Wt. | None | 5 | 10 | 15 | 5 | 10 | 15 | None | 5 | 10 | 15 | 5 |
| Glass Type | A | A | A | A | A | A | A | B | B | B | B | B |
| Electrical Properties | | | | | | | | | | | | |
| Leakage Current $\mu A/cm^2$ | 1.6 | 2.7 | 65 | 10K | 1.9 | 3.5 | 4.3 | 0.8 | 4.1 | 50 | 14.9K | 10.5 |
| Breakdown Voltage VDC/mil | 1340 | 1170 | 1100 | 790 | 1180 | 860 | 1160 | 690 | 1060 | 1370 | 750 | 1040 |

| Example No. | 13 | 14 | 15 | 16 | 17 | 18 | 19 | 20 | 21 |
|---|---|---|---|---|---|---|---|---|---|
| Ceramic Addition | | | | | | | | | |
| Composition | $SiO_2$ | $SiO_2$ | Control | $Al_2O_3$ | $Al_2O_3$ | $Al_2O_3$ | $SiO_2$ | $SiO_2$ | $SiO_2$ |
| Amount, % Wt. | 10 | 15 | None | 5 | 10 | 15 | 5 | 10 | 15 |
| Glass Type | B | B | C | C | C | C | C | C | C |
| Electrical Properties | | | | | | | | | |
| Leakage Current $\mu A/cm^2$ | 595 | >100K | 48 | 13 | 14 | 7 | 15.5 | 751 | >100K |
| Breakdown Voltage VDC/mil | 930 | 1090 | 510 | 890 | 1000 | 1370 | 560 | 530 | 530 |

Looking at Examples 2-4, it can be seen that the addition of $Al_2O_3$ to Glass A is highly detrimental to leakage current at concentrations as low as 10% wt. On the other hand breakdown voltage is reduced only moderately by higher amounts of $Al_2O_3$. By comparison. Examples 5-7 show that additions of $SiO_2$ up to at least 15% wt. in glass A do not degrade substantially either leakage current or breakdown voltage. Similarly, Examples 9-14 show that the addition of as little as 10% $Al_2O_3$ or $SiO_2$ to glass B severely degrades leakage current with moderate degradation of breakdown voltage. However, the addition of $Al_2O_3$ to glass C is quite unique in that even at concentrations of 15% wt. leakage current was actually reduced slightly and breakdown voltage was raised slightly. Nevertheless, when $SiO_2$ was added to glass C, even 5% addition was significantly detrimental to leakage current and highly detrimental to breakdown voltage.

The foregoing data do show that quite small amounts of either $Al_2O_3$ or $SiO_2$ can be used in the crystalline glass dielectric composition in small amounts up to as much as 15% wt. by selection of a particular ceramic additive for use with a given glass. Prior art compositions require as much as 50% wt. of such additions to obtain equivalent results.

The above data generally confirm the results of the tests of Examples 1-21. The alumina by itself (Examples 23 and 24) caused substantial change in leakage current, but relatively little, if any, effect on breakdown voltage. The $SiO_2$ by itself (Example 25) caused somewhat less degradation than $Al_2O_3$ and had about the same effect as $Al_2O_3$ on breakdown voltage. The mixtures of both $Al_2O_3$ and $SiO_2$ (Examples 26 and 27) showed less adverse effect on leakage current than $Al_2O_3$ alone and gave uniformly a desirable increase in breakdown voltage.

EXAMPLES 28-32

In Examples 28-32 two lots of Glass A to which $Al_2O_3$ had been added were compared to the glass by itself to observe the effect of $Al_2O_3$ on bowing of substrates to which pastes thereof had been applied and fired. The substrates were each tested for leakage current, substrate bowing (after 20 firing cycles and were observed at 7× magnification with respect to blistering. The results of these tests are given in Table 4 below.

TABLE 4

| | Effect of Ceramic Addition On Substrate Bowing | | | | |
|---|---|---|---|---|---|
| Example No. | 28 | 29 | 30 | 31 | 32 |
| Dielectric Compositions % wt. | | | | | |
| Glass A, lot 1 | 100 | 95 | — | — | — |
| Glass A, lot 2 | — | — | 85 | 95 | — |
| Glass A, lot 3 | — | — | — | — | 95 |
| $Al_2O_3$ | — | 5 | 15 | 5 | 5 |
| Leakage Current, $\mu A/cm^2$ | 1.9 | 2.7 | 0.4 | 17.1 | 20.5 |
| Blistering | None | None | None | None | None |
| Substrate Bowing, mils | +7.1 | +1.0 | +3.8 | −1.2 | −0.7 |

In all three lots of glass A, the $Al_2O_3$ was very effective in reducing substrate bowing to an acceptably small value. It is interesting to note that the $Al_2O_3$ was less effective to reduce substrate bowing when used at a relatively higher concentration. No blistering was shown in any of the dielectric layers.

I claim:

1. A printable thick film dielectric composition consisting essentially of an admixture of finely divided particles of (a) an amorphous aluminoborosilicate glass which upon firing at Thick Film Processing Conditions forms a single crystalline phase of $Ba_2AlSi_2O_8$ in a matrix of remainder glass; (b) 1-15% wt., basis total solids, of a ceramic material selected from $Al_2O_3$, $SiO_2$, complex oxides of $Al_2O_3$ and $SiO_2$, $Si_3N_4$, AlN, complex nitrides $Si_3N_4$ and AlN and mixtures thereof, the admixture being dispersed in (c) organic medium.

2. A printable thick film dielectric composition consisting essentially of an admixture of finely divided particles of (a) an amorphous aluminoborosilicate glass which upon firing at Thick Film Processing Conditions forms a single crystalline phase of an aluminate of Ba, Ca, Mg or Zn dispersed in a matrix of remainder glass; (b) 1-15% wt., basis total solids, of a ceramic material selected from $Al_2O_3$, $SiO_2$, complex oxides of $Al_2O_3$ and $SiO_2$, $Si_3N_4$, AlN, complex nitrides $Si_3N_4$ and AlN and mixtures thereof, the admixture being dispersed in (c) organic medium.

3. A printable thick film dielectric composition consisting essentially of an admixture of finely divided particles of (a) an amorphous aluminoborosilicate glass having the composition 30% $SiO_2$, 8% $TiO_2$, $ZrO_2$ or mixtures thereof, 10% $Al_2O_3$, 26% BaO, 10% ZnO, 6% CaO, 8% $B_2O_3$, and 2% MgO; (b) 1-15% wt., basis total solids, of a ceramic material selected from $Al_2O_3$, $SiO_2$, complex oxides of $Al_2O_3$ and $SiO_2$, $Si_3N_4$, AlN, complex nitrides of $Si_3N_4$ and AlN and mixtures thereof, the admixture being dispersed in (c) organic medium.

4. A printable thick film dielectric composition consisting essentially of an admixture of finely divided particles of (a) an amorphous aluminoborosilicate glass having the composition 30% $SiO_2$, 8% $TiO_2$, $ZrO_2$ or mixtures thereof, 10% $Al_2O_3$, 10% BaO, 10% ZnO, 24% CaO and 8% $B_2O_3$; (b) 1-15% wt., basis total solids, of a ceramic material selected from $Al_2O_3$, $SiO_2$, complex oxides of $Al_2O_3$ and $SiO_2$, $Si_3N_4$, AlN, complex nitrides of $Si_3N_4$ and AlN and mixtures thereof, the admixture being dispersed in (c) organic medium.

5. A printable thick film dielectric composition consisting essentially of an admixture of finely divided particles of (a) an amorphous aluminoborosilicate glass having the composition 30% $SiO_2$, 8% $TiO_2$, $ZrO_2$ or mixtures therof, 12% $Al_2O_3$, 12% BaO, 24% ZnO, 6% CaO and 8% $B_2O_3$; (b) 1-15% wt., basis total solids, of a ceramic material selected from $Al_2O_3$, $SiO_2$, complex oxides of $Al_2O_3$ and $SiO_2$, $Si_3N_4$, AlN, complex nitrides of $Si_3N_4$ and AlN and mixtures thereof, the admixture being dispersed in (c) organic medium.

* * * * *